United States Patent [19]
Ishimatsu et al.

[11] Patent Number: 5,457,328
[45] Date of Patent: Oct. 10, 1995

[54] SEMICONDUCTOR LIGHT EMITTING DEVICE HAVING STRONG DIRECTIVITY OF LIGHT EMISSION

[75] Inventors: Sumio Ishimatsu, Machida; Katuhiko Nisitani, Kawasaki, both of Japan

[73] Assignee: Kabushiki Kaisha Toshiba, Kanagawa, Japan

[21] Appl. No.: 262,498

[22] Filed: Jun. 20, 1994

[30] Foreign Application Priority Data

Jun. 21, 1993 [JP] Japan .................. 5-149017

[51] Int. Cl.⁶ .................................. H01L 33/00
[52] U.S. Cl. .................. 257/95; 257/96; 257/97; 257/98; 372/48; 372/50; 372/99
[58] Field of Search ................... 257/95, 96, 97, 257/98, 94; 372/45, 46, 48, 50, 99

[56] References Cited

U.S. PATENT DOCUMENTS 4,249,967  2/1981  Liu et al. .................. 257/96 X
5,289,018  2/1994  Okuda et al. .................. 257/98

FOREIGN PATENT DOCUMENTS 1282882  11/1989  Japan .

*Primary Examiner*—William Mintel
*Attorney, Agent, or Firm*—Finnegan, Henderson, Farabow, Garrett & Dunner

[57] ABSTRACT

A semiconductor light emitting device has an emittive layer formed on a semiconductor substrate, the emittive layer which emits light by being activated with an electric current. Between the substrate and the emittive layer, a reflective layer is formed. In addition, an electrode, which has an aperture for transmitting light emission to the outside of this device, is provided on the emittive layer. In such a structure, at least either one of the reflective layer or the emittive layer is selectively formed right under the aperture formed in the electrode and has the same area as that of the aperture. According to this structure, the emitted light generated laterally from this device is so suppressed that the directivity of light emission is greatly improved in this device.

7 Claims, 2 Drawing Sheets

SEMICONDUCTOR LIGHT EMITTING DEVICE HAVING STRONG DIRECTIVITY OF LIGHT EMISSION

BACKGROUND OF THE INVENTION

1. Field of the invention

This invention relates to a semiconductor light emitting device, and more particularly to a semiconductor light emitting device having strong directivity of light emission.

2. Description of the prior art

Recently, various kinds of light emitting diode, which are made from compound semiconductor materials, such as InGaAlP and GaAlAs, and of the type of direct transition, have been developed. In particular, InGaAlP diodes emit red to yellow-green light by direct transition so that they are expected to be a light source having high luminous efficiency.

FIGS. 1A and 1B show the schematic structure of a prior art light emitting diode of the kind mentioned above having high luminous efficiency. Especially, FIG. 1A shows the cross-sectional view and Fig. 1B shows the plain view of this diode.

As shown in these figures, the light emitting diode has an n-type GaAs substrate 51. An n-type GaAs buffer layer 52, a reflection layer 53, a first clad layer 54 made of n-type InCaAlP, an active (emittive) layer 55 made of undoped InGaAlP, and a second clad layer made of p-type InGaAlP are formed on substrate 51 in this order. Reflection layer 53 has a multilayer structure which is comprised of about 10 pairs of an n-type GaAs layer and an n-type InAlP layer, each of which overlaps the other alternatively. These two kind of layers, that is, n-type GaAs layers and n-type InAlP layers, have different refractive indices from each other. In addition, an n-type GaAs layer 58 is formed on layer 56 in order to interrupt a current flow. However, an aperture 57 is formed in layer 58 so that the current flows through this aperture. Layer 58 is covered by a p-type GaAlAs layer 59 which is to diffuse an electric current. An ohmic electrode 61 of p-type having an aperture 60 (light window) is formed on layer 59. This aperture 60 is provided in order to release the emitted light out of this device, and therefore, it is placed right over aperture 57 and has the same area as that of aperture 57. On the other hand, an ohmic electrode of n-type is formed on the back side of substrate 51.

In the light emitting diode having the structure mentioned above, an electric current supplied via p-type electrode 61 flows through diffusion layer 59 and clad layer 56 and reaches active layer 55 where light emission takes place. In this case, the current flowing through layer 59 is focused with aperture 57 and then applied on a particular area 63 of layer 55, the area which is right under aperture 57. Accordingly, a large amount of current is concentrated to area 63 and so, strong light emission is obtained from this area.

A part of light energy emitted upwards from area comes out of this light emitting diode through aperture 57 and light window 60. On the other hand, the other part of light energy emitted downwards from area 63 is reflected by layer 53 towards the upper direction and comes out of this diode through aperture 57 and light window 60 without being absorbed by substrate 51. As a result, almost all the light energy can be obtained through window 60, and so, a light emitting diode having high luminous efficiency is obtained.

However, the prior art light emitting diode has the following disadvantage. In this diode, most of the current applied through electrode 61 is concentrated to area 63 of active layer 55, the area 63 which is right under aperture 57. This permits the device to emit strong light in area 63. At the same time, however, a small amount of the current leaks out from area 63 of active layer 55, thus permitting weak emission in the circumference of this area. The emitted light from the circumference of area 63 comes out of this device through both sides of layer 55 directly or indirectly being reflected by reflection layer 53, as shown by arrows 64 in FIG. 1. As a result, light emission appears not only in the direction perpendicular to window 60 but in the lateral direction of this device.

When the light emitting diode mentioned above is used in a camera as a light source for printing dates on a film, the light emitted in the lateral direction of this diode reaches the film to expose, in addition to the light obtained through window 60. As a result, the resultant image on the film is not focused and it loses sharpness.

As explained above, the reflective layer of the prior art light emitting diode is formed to cover the entire surface of the active layer, and the emitted area is restricted to a particular area of the active layer due to the existence of an aperture provided in the current stopping layer. Therefore, weak emission, which is produced by a leakage current in the circumference of the emitted area, comes out through both sides of this device directly or indirectly being reflected by the reflective layer. In other words, light emission is seen from this diode not only in the main direction of emission but in the direction perpendicular to the main direction.

According to the above mentioned reason, the directivity of light emission of the prior art light emitting diode is not so strong. Therefore, a sharp image is not obtained when the diode is used as a light source. This is emphasized especially in the case where the target to be imaged by this light emitting diode is small.

SUMMARY OF THE INVENTION

This invention has been made to overcome the above mentioned problem of the prior art light emitting diode.

Therefore, one objective of this invention is to provide a semiconductor light emitting device having a strong directivity of light emission so as to form a sharp image.

Another objective of this invention is to provide a semiconductor light emission device which can suppress the leakage of light emission from the lateral of this device, whereby a sharp image is obtained when the device is used as a light source for a small target to be imaged.

In order to accomplish the above mentioned objectives, the light emitting device of the present invention has a semiconductor substrate, a reflective layer formed on the substrate, and an active layer which is formed on the reflective layer and emits light by being activated with a current. In addition, on the top surface of this device, a light window is provided in order to align emitted light with one direction.

According to the first feature of the present invention, said reflective layer is so formed that the reflective surface is selectively formed right under said light window and has substantially the same area as that of the light window. Due to this structure, the light emission caused by a leakage current, which exists in the circumference of the emittive area, is not reflected by the reflective layer, but it is absorbed by the substrate. As a result, the emitted light towards the lateral direction of this device is strongly suppressed to improve the directivity of light emission of this device.

According to the second feature of the present invention, said active layer is selectively formed on the reflective layer so that it is placed right under the light window and has substantially the same areas as that of the light window. Due to this structure, the emittive area of this device is limited within an area right under the light window. As a result, the light emission towards the lateral direction of this device is highly suppressed to improve the directivity of light emission of this device.

According to the third feature of the present invention, both of said active layer and said reflective layer are selectively formed so that they are placed right under the light window and have substantially the same area as that of the light window. Due to this structure, the light emission towards the lateral direction of this device is greatly suppressed to improve the directivity of light emission.

These and other objectives, features, and advantages of the present invention will be more apparent from the following detailed description of the preferred embodiments in conjunction with the accompanying drawings.

DETAILED DESCRIPTION OF PREFERRED EMBODIMENTS

Figure 1A:
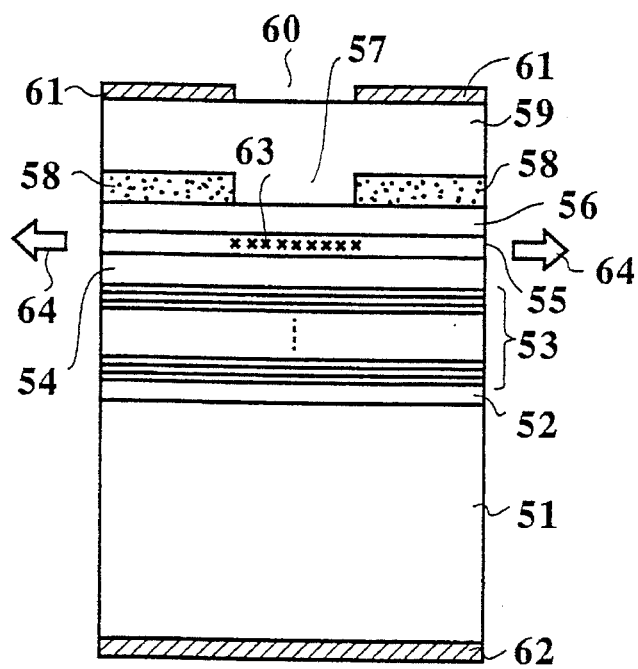
FIG. 1A a cross-sectional view of a prior art light emitting diode.
Figure 1B:
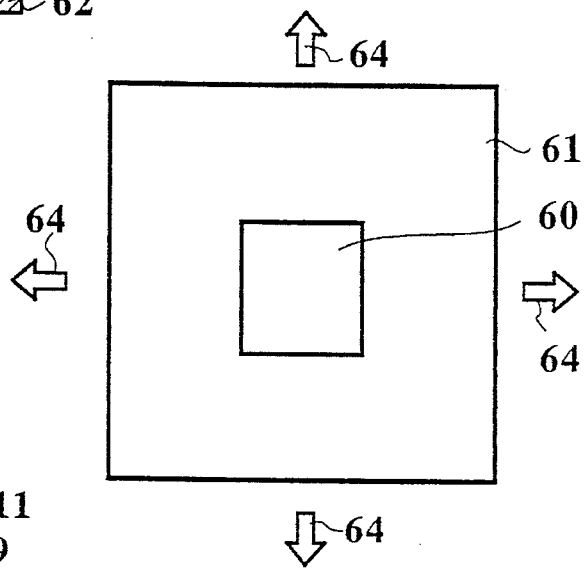
FIG. 1B is a plain view of the prior art light emitting diode.
Figure 2:
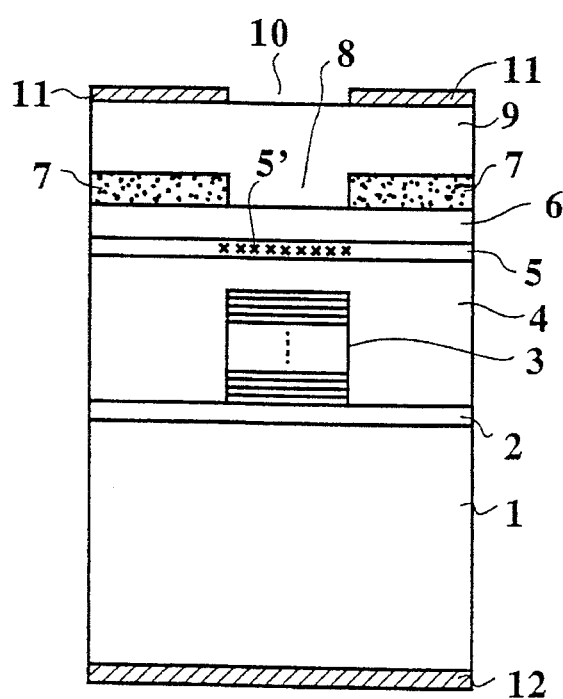
FIG. 2 is a cross-sectional view of a light emitting device according to the first embodiment of the present invention.

FIG. 2 shows schematically the cross-sectional structure of a semiconductor light emitting device according to the first embodiment of the present invention. As shown in FIG. 2, this device includes an n-type GaAs substrate 1, an n-type GaAs buffer layer 2, and a reflective layer 3 having a multi-layer structure, which is selectively grown on one part of buffer layer 2. Reflective layer 3 is covered with a clad layer 4 which is made of n-type In(GaAl)P. An active layer 5, which is made of undoped In(GaAl)P, is grown on layer 4. Layer 5 is covered with a clad layer 6 which is made of p-type In(GaAl)P. A current stopping layer 7, which is made of n-type GaAs and has an aperture 8, is grown on clad layer 6. Layer 7 and a part of layer 6 under aperture 8 are covered with a p-type GaAlAs layer 9 which is to diffuse an electric current. Then, p-type ohmic electrode 11 is formed on layer 9 and n-type ohmic electrode 12 is formed on the back surface of substrate 1. In this case, a light window 10 is formed on electrode 11 in order to take out light emission from this device. In addition, light window 10, aperture 8, and the reflective surface of layer 3 have almost the same areas to each other and are placed in a row, as shown in FIG. 2.

Next, the fabrication method of this device will be explained to show the detailed structure.

Each layer grown on n-type GaAs substrate 1 is formed using a MOCVD (Metal Organic Chemical Vapor Deposition) method. Trimethylindium (TMI), trimethylgallium (TMG), and trimethylaluminum (TMA) are used as the material gases for group 3 elements. On the other hand, phosphine ($PH_3$) and arsine ($ASH_3$) are used as the material gases for group 5 elements. In addition, dimethylzinc (DMZ) is used as an n-type dopant and silan ($SiH_4$) is used as a p-type dopant. These reactive gases are delivered on substrate 1, which is heated under a vacuum of 30 to 100 tort, using hydrogen gas as a carrier.

First, Si doped (about $3 \times 10^{18}$ $cm^{-3}$) n-type GaAs buffer layer 2 is grown, using the above mentioned material gases and dopants, on n-type GaAs substrate 1 which is doped with Si of about $3 \times 10^{18}$ $cm^{-3}$ concentration and 15° off from [100] plane toward [110] plane. The thickness of GaAs buffer layer 20 is about 0.5 μm. In this embodiment, the thickness of GaAs substrate 1 is set to be about 250 μm, however, this thickness can be determined arbitrarily.

Next, 10 pairs of an n-type $In_{0.5}Al_{0.5}P$ layer doped with Si of about $3 \times 10^-$$cm^{-3}$ concentration and an n-type GaAs layer doped with Si of about $3 \times 10^{18}$ $cm^{-3}$ concentration are formed on GaAs buffer layer 2, thus providing a reflective layer having a 20 layer structure. The thickness of an InAlP layer is about 0.044 μm and it is about 0.0375 μm for a GaAs layer. By the photoresist method using resist films, a part of the reflective layer is selectively etched out, thus providing reflective layer 3 having a mesa shape on buffer layer 2. As will be described later, layer 3 is placed right under the light window 10 and aperture 8, and has almost the same area as those of light window 10 and aperture 8.

The exposed surface of buffer layer 2 and reflective layer 3 are then covered with clad layer 4 which is made of n-type $In_{0.5}(Ga_{0.3}Al_{0.7})_{0.5}P$ doped with Si of about $3 \times 10^{18}$ $cm^{-3}$ concentration. In actuality, layer 4 is grown of about 0.6 μm thickness on the upper surface of layer 3. Then, active layer (emittive layer) 5 is grown on clad layer 4. Layer 5 is made of un-doped $In_{0.5}(Ga_{0.7}Al_{0.3})_{0.5}P$ and has a thickness of about 0.6 μm. Second clad layer 6 is then grown on active layer 5. Layer 6 is made of p-type $In_{0.5}(Ga_{0.3}Al_{0.7})_{0.5}P$ doped with Zn of about $5 \times 10^{17}$ $cm^{-3}$ concentration and has a thickness of about 0.6 μm. As a result, a double hereto structure is formed on GaAs substrate 1.

Thereafter, n-type GaAs layer 7, which is doped with Si of about $5 \times 10^{17}$ $cm^{-3}$ concentration and has a thickness of about 0.15 μm, is grown on clad layer 6. This layer 7 works as a current stopping layer. A part of this layer is then removed selectively by the photoetching method using a resist film as an etching mask. Thus, a part of the surface of clad layer 6 is exposed to form an aperture 8 in layer 7. Aperture 8 is provided in order to focus the current flowing through layer 9 onto the central part of active layer 5, thus enabling strong emission in this part. The area of aperture 8 is set to be almost the same as that of the upper surface of reflective layer 3. In addition, aperture 8 is placed right over the reflective layer 3.

Current diffusion layer 9, which is made of p-type $Ga_{0.3}Al_{0.7}As$, is then grown to the thickness of about 7 μm on layers 6 and 7. P-type ohmic electrode 11 is formed on layer 9. There is provided an aperture 10 on electrode 11 in order to form the light window, through which light emission appears. On the other hand, an n-type ohmic electrode 12 is formed on the back surface of substrate 1.

Lastly, the multi-layer structure mentioned above is diced in a predetermined pitch in order to form a plurality of plets. Thus, a semiconductor light emitting device is obtained according to the first embodiment of this invention.

In this device shown in FIG. 2, an electric current is provided through electrodes 11 and 12. Because layer 7 does not transmit an electric current, this current flows into layer 6 through aperture 8 and reaches the central part 5' of active layer 5. Thus, the current is focused onto the central part of layer 5 so as to produce strong emission in this area. In this case, the light emitted upwards is released out of this device through window 10. On the other hand, the light emitted downwards is reflected upwards by reflective layer 3 and released out of this device through window 10.

As mentioned above, most of the current provided via electrodes 11 and 12 is focused onto the central part of active layer 5 to give strong light emission. However, there is still a small leakage of current in the circumference of layer 5, thus causing weak emission. In this weak emission, the light emitted downwards is absorbed by the layers 4, 2, and 1 formed under layer 5 without being reflected by reflective layer 3. As a result, this light is not released out of this device through both sides of layer 5.

As explained above, the semiconductor light emitting device of this embodiment has reflective layer 8 which is selectively formed right under window 10 and has substantially the same area as that of window 10. Therefore, the device can greatly reduce the light emission which is released out of this device in the direction perpendicular to the direction of light emission obtained through window 10. As a result, the emitted light from this device does not spread so much, thus suppressing the fading phenomenon of the light image. So, the device of this embodiment can make a sharp image when it is used as a light source for a small target. This device is, therefore, very useful as a light source for printing characters and figures on a film.

The second embodiment of the present invention will be described next.

Figure 3:
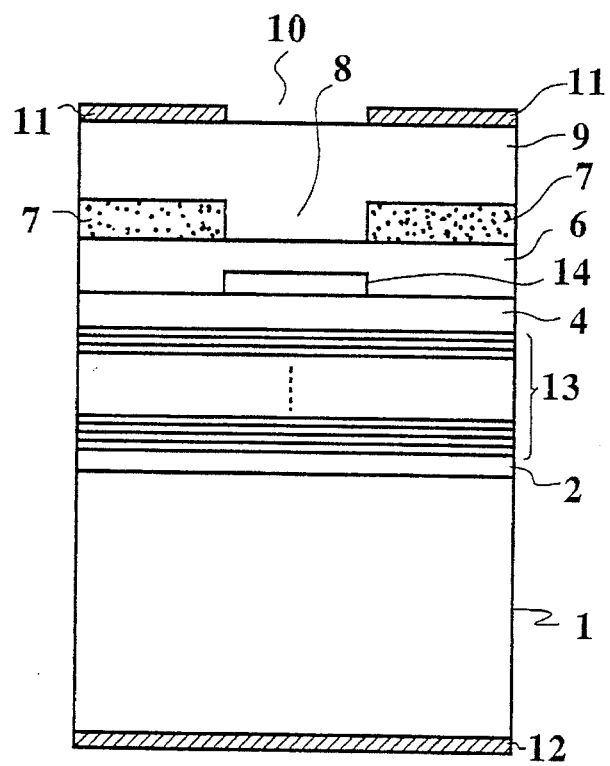
FIG. 3 is a cross-sectional view of a light emitting device according to the second embodiment of the present invention.

FIG. 3 shows schematically the cross-sectional structure of the semiconductor light emitting device according to the second embodiment of the present invention. As shown in this figure, the device of this embodiment is characterized by the fact that reflective layer 13 is formed to cover the whole surface of buffer layer 2 while active layer 14 is selectively formed on a particular area of clad layer 4, the area which is just under window 10. According to this structure, the light emittive area is restricted within the central part of this device. So, the light emission from the circumference of this device is greatly reduced, thus providing the same advantage as that of the first embodiment.

In FIG. 3, the same numbers as those shown in FIG. 2 indicate the same or the similar structure members fabricated in the same manner.

The third embodiment of the present invention will be described next.

Figure 4:
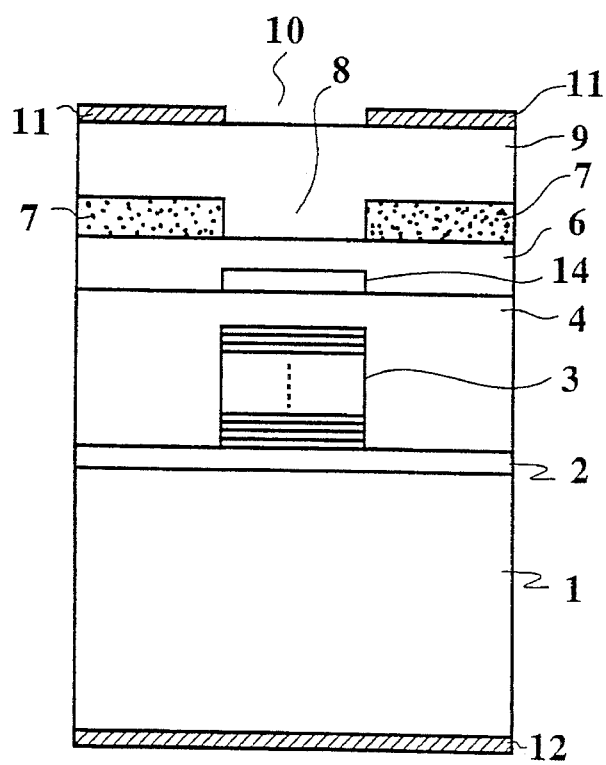
FIG. 4 is a cross-sectional view of a light emitting device according to the third embodiment of the present invention.

FIG. 4 shows the cross-sectional structure of the semiconductor light emitting device according to the third embodiment. As shown in this figure, the device of this embodiment is characterized by the fact that both reflective layer 3 and active layer 14 are selectively formed in a way that they are placed right under window 10 and have substantially the same areas as that of aperture 8 and window 10. According to this structure, the light emission from the circumference of this device can be reduced more than that of the first or second embodiment. In FIG. 4, the same numbers as those shown in FIGS. 2 and 3 indicate the same or the similar structure members fabricated in the same manner.

The present invention should not be restricted to the above mentioned embodiments. For example, semiconductor materials and their mixing rate may be changed in order to change the wavelength and the characteristics of light emission. In fact, GaAlAs may be used to form a hetero structure. In addition, p-type semiconductor substrate may be used instead of n-type substrate 1. In this case, the conductivity types of other layers should be reversed.

In summary, the semiconductor light emitting device of this invention can greatly reduce the light emission which is released out of this device in a direction perpendicular to the main direction of light emission. So, the device can have strong directivity of light emission, thus enabling to produce a sharp image for a small target when it is used as a light source.

What is claimed is:

1. A semiconductor light emitting device, comprising:

a semiconductor substrate;

a reflective layer formed on said substrate;

a light emissive layer formed on said reflective layer, said light emissive layer emitting light by being activated with an electric current; and a top surface electrode formed on said light emissive layer, said electrode having a first aperture for releasing emitted light out of the device;

wherein said light emissive layer is selectively formed beneath said first aperture and has an emissive area which is substantially the same as that of said first aperture.

2. A semiconductor light emitting device, comprising:

a semiconductor substrate;

a reflective layer formed on said substrate;

a light emissive layer formed on said reflective layer, said light emissive layer emitting light by being activated with an electric current; and a top surface electrode formed on said light emissive layer, said electrode having a first aperture for releasing emitted light out of this device;

wherein both of said light emissive layer and said reflective layer are selectively formed beneath said first aperture and have substantially the same area as that of said first aperture.

3. The semiconductor light emitting device as claimed in claim 1, or 2, further including a current stopping layer formed between said electrode and said light emissive layer, said current stopping layer having a second aperture which has substantially the same area as that of said first aperture and is placed beneath said first aperture.

4. The semiconductor light emitting device as claimed in claim 1, or 2, wherein said semiconductor substrate is made of GaAs and said light emissive layer is made of InGaAlP.

5. The semiconductor light emitting device as claimed in claim 1, or 2, wherein said reflective layer is comprised of about 10 pairs of an InAlP layer and a GaAs layer, each of which has the different refractive index.

6. A semiconductor light emitting device, comprising:

a GaAs substrate;

a GaAs buffer layer formed on said substrate;

a reflective layer formed on said substrate and comprised of about 10 pairs of an InAlP layer and a GaAs layer, the InAlP layer and the GaAs layer in each pair having different refractive indices from each other;

a first clad layer made of InGaAlP, said clad layer being formed on said reflective layer;

a light emissive layer made of InGaAlP formed on said first clad layer;

a second clad layer made of InGaAlP formed on said light emissive layer;

a GaAs current stopping layer formed on said second clad layer, said current stopping layer having a first aperture for conducting an electric current;

a GaAlAs layer formed on said current stopping layer for diffusing the electric current;

an upper electrode formed on said GaAlAs layer, said electrode having a second aperture formed over said first aperture and having substantially the same area as that of the first aperture; and a back surface electrode formed on the back surface of said substrate;

wherein at least one of said light emissive layer and said reflective layer is selectively formed beneath said first and second apertures and has substantially the same area as those of said first and second apertures.

7. The semiconductor light emitting device as claimed in claim 6 wherein said substrate, buffer layer, reflective layer, first clad layer, and current stopping layer have an n-type conductivity, while said light emittive layer has an i-type conductivity and said second clad layer and said current diffusing layer have a p-type conductivity.

\* \* \* \* \*